(12) United States Patent
Braun et al.

(10) Patent No.: US 6,724,685 B2
(45) Date of Patent: Apr. 20, 2004

(54) CONFIGURATION FOR DATA TRANSMISSION IN A SEMICONDUCTOR MEMORY SYSTEM, AND RELEVANT DATA TRANSMISSION METHOD

(75) Inventors: Georg Braun, München (DE); Hermann Ruckerbauer, Moos (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/284,773

(22) Filed: Oct. 31, 2002

(65) Prior Publication Data

US 2003/0099149 A1 May 29, 2003

(30) Foreign Application Priority Data

Oct. 31, 2001 (DE) ........................................ 101 53 657

(51) Int. Cl.[7] ................................................ G11C 8/00
(52) U.S. Cl. ....................................... 365/233; 365/194
(58) Field of Search ................................. 365/233, 194

(56) References Cited

U.S. PATENT DOCUMENTS 5,359,232 A * 10/1994 Eitrheim et al. ............. 327/116
5,369,640 A * 11/1994 Watson et al. ............... 714/700
5,625,805 A * 4/1997 Fenwick et al. ............. 713/503
5,642,069 A * 6/1997 Waite .......................... 327/292
5,828,871 A 10/1998 Kawaguchi et al.

* cited by examiner

*Primary Examiner*—Son T. Dinh
(74) *Attorney, Agent, or Firm*—Laurence A. Greenberg; Werner H. Stemer; Ralph E. Locher

(57) ABSTRACT

In a configuration for data transmission in a semiconductor memory system, in which data are transmitted between at least one semiconductor memory module and a memory controller controlled by a system clock signal, additional sense clock signal lines are led between the memory controller and the memory modules and, via loops on the memory modules, are led back directly from the memory modules to the memory controller component. By transmitting a sense clock signal from the memory controller to each of the memory modules via the additional sense clock signal lines, the memory controller is able to measure the respective signal propagation time of the sense clock signal and adjust a delay time for the data signals respectively received from the memory modules appropriately. The use of a data strobe signal and the associated disadvantages when testing the memory system or the memory modules is rendered superfluous.

17 Claims, 3 Drawing Sheets

CONFIGURATION FOR DATA TRANSMISSION IN A SEMICONDUCTOR MEMORY SYSTEM, AND RELEVANT DATA TRANSMISSION METHOD

BACKGROUND OF THE INVENTION

Field of the Invention

The invention relates to a configuration for data transmission and a data transmission method. The data is transmitted between a semiconductor memory module set up for this purpose and a memory controller module controlled by a system clock signal.

With increasing rapidity of data transmission in semiconductor memory systems, it has become more difficult to correctly receive the data that is sent from a semiconductor memory module (e.g. DRAM) to a memory controller. This is increasingly difficult above all at very high data transmission frequencies, since the propagation times of the transmitted data signals are longer than the period of the individual data bits.

Nowadays a data strobe signal, as it is known, is used in double data rate (DDR) memory systems. The data strobe signal is an additional signal that, together with the data, is sent from the semiconductor memory module to the memory controller.

By using the data strobe signal, the memory controller is able to detect which phase angle the incoming data has.

The use of the data strobe signal has the disadvantage that the test of the relative time position between the data strobe signal and the data response signal by the memory modules is very time-consuming and costly. Since complicated routines are often needed for this purpose the testing time is increased, which has a detrimental effect on the cost structure. A data strobe signal is normally used for each memory module, which increases the number of pins for the memory connecting plug and therefore, likewise the costs.

SUMMARY OF THE INVENTION

It is accordingly an object of the invention to provide a configuration for data transmission in a semiconductor memory system, and a relevant data transmission method, that overcome the above-mentioned disadvantages of the prior art devices and methods of this general type, in which data is transmitted between at least one semiconductor memory module and a memory controller controlled by a system clock signal, in such a way that a data transmission at very high speed is possible and at the same time the disadvantages associated with the use of the data strobe signal can be avoided. A further object of the invention is to specify a data transmission method for a semiconductor memory system of this type which makes possible very fast data transmission between the memory controller and the at least one semiconductor memory module and which avoids the above-described disadvantages of the use of the data strobe signal. Another object of the invention is to specify a memory controller module set up for this data transmission method and a semiconductor memory module set up for this purpose.

With the foregoing and other objects in view there is provided, in accordance with the invention, a configuration for transmitting data in a semiconductor memory system. The configuration contains at least one semiconductor memory module and a memory controller controlled by a system clock signal. The memory controller has a clock generating device producing a sense clock signal in addition to the system clock signal. The data is transmitted between the memory controller and the semiconductor memory module. A clock line is connected between the semiconductor memory module and the memory controller. The clock line transmits the system clock signal to the memory module. At least one separate sense clock line extends from the memory controller to the semiconductor memory module and directly back to the memory controller. The separate sense clock line transmits the sense clock signal to the semiconductor memory module and from the semiconductor memory module back to the memory controller. The memory controller further has a propagation time measuring device connected to the separate sense clock line for measuring a propagation time of the sense clock signal transmitted over the separate sense clock line and a delay time adjusting device connected to the propagation time measuring device. The delay time adjusting device adjusts a delay time corresponding to the propagation time needed by the data transmitted from the semiconductor memory module to the memory controller. The memory controller adjusts the delay time of the delay time adjusting device in accordance with the propagation time, measured by the propagation time measuring device, of the sense clock signal transmitted over the separate sense clock line.

According to a first aspect of the invention, the first part of the object is achieved in that the memory controller has a clock generating device which produces a sense clock signal in addition to the system clock signal. In the memory system, at least one additional sense clock line leads to the memory module and from there directly back to the memory controller, the sense clock line transmitting the sense clock signal to the memory module and from there back to the memory controller. The memory controller further has a propagation time measuring device for measuring the propagation time of the sense clock signal transmitted via the sense clock line and a delay time adjusting device, which are set up to adjust a delay time which corresponds to the propagation time needed by the data transmitted from the respective memory module to the memory controller. The memory controller adjusts the delay time of the delay time adjusting device in accordance with the propagation time, measured by the propagation time measuring device, of the sense clock signal transmitted via the sense clock line.

The inventive step therefore lies in leading an additional clock signal, the sense clock signal, from the memory controller to the semiconductor memory module and back to the memory controller via at least one additional sense clock line in the semiconductor memory system. In the memory controller there is the propagation time measuring device which determines the propagation time of the sense clock signal transmitted via the sense clock line, and the delay adjusting device which is set up to adjust a delay time which corresponds to the propagation time needed by the data transmitted from the respective memory module to the memory controller. The delay time being set in accordance with the propagation time, measured by the propagation time measuring device of the sense clock signal transmitted via the sense clock line. In the event that a plurality of semiconductor memory modules possibly having different specifications are driven by the memory controller, the propagation times of the sense clock signals transmitted via the sense clock lines from the memory controller to the memory modules and from there back to the memory controller are as a rule different. Since the memory controller knows from which memory module it has requested the data, the appropriate delay times for the individual memory modules can be adjusted on the delay adjusting device. A precondition for this is that the propagation time measuring device for measuring the propagation time of the sense clock signals transmitted via the sense clock line are present in the memory controller. The invention is not restricted to two memory modules. More or fewer than two memory modules are possible. Likewise, the scope of the invention includes memory systems in which the memory modules are not accommodated on separate circuit board substrates but, together with the memory controller, on one circuit board substrate. Therefore, the memory modules are then located on the main circuit board, as are the memory controller and the corresponding system clock lines and the additional sense clock lines. In the case of the data transmission according to the invention, it is important that the sense clock lines, which are driven by the memory controller, are looped back directly from the respective memory module to the memory controller without an additional clock module being used on the memory module, such as, for example, a PLL or DLL circuit.

According to one development, however, various passive components such as resistors and/or capacitors and/or inductors can be connected to the sense clock line, for example on the memory module, in order to match the time delay of the sense clock line to the system requirements.

Furthermore, in another development of the invention, the sense clock signal on the sense clock lines can be generated intermittently, that is to say that in a holding state it remains constant and, in the process, assumes a state "low" or "high" or "state of high impedance". In this way, the propagation times can be measured again and again. As long as the sense clock line transmits a periodic sense clock signal, it can be used to determine the phase angle of the data in the memory controller.

The clock generating device can generate the sense clock signal at the same or an integer multiple of the frequency of the system clock signal.

According to a further aspect of the invention, a memory controller module for use in a data transmission configuration in a semiconductor system is proposed. Data is transmitted between at least one semiconductor memory module and the memory controller module controlled by a system clock signal. The memory controller module has a clock generating device which generates a sense clock signal which has the same frequency or an integer multiple of the frequency of the system clock signal, a sense clock receiving device for receiving the sense clock signal transmitted via a sense clock line to the memory module and from there back to the memory control module, a propagation time measuring device for measuring a propagation time of the sense clock signal transmitted via the sense clock line and a delay adjusting device, which is set up for the adjustment of a delay time corresponding to the propagation time of the data transmitted from the respective memory module to the memory controller. The delay adjusting device adjusts the delay time in accordance with the propagation time of the received sense clock signal as measured by the propagation time measuring device.

According to a further aspect of the invention, a semiconductor memory module for use in a semiconductor memory system is proposed, in which data is transmitted between the semiconductor memory module and a memory controller controlled by a system clock signal. The semiconductor memory module has terminals and at least one conductor loop for connecting a sense clock line and for looping a sense clock signal generated by the memory controller and transmitted via the sense clock line directly through the semiconductor memory module.

According to a further aspect of the invention, a method for data transmission in a semiconductor memory system is proposed, in which the data is transmitted between at least one semiconductor memory module and a memory controller controlled by a system clock signal. The method includes:

a) generating a sense clock signal in the memory controller in addition to the system clock signal;

b) leading at least one additional sense clock line from the memory controller to the memory module and from there directly back to the memory controller;

c) transmitting the additional sense clock signal via the additional sense clock lines from the memory controller to the memory module and from there back to the memory controller;

d) measuring the propagation time of the sense clock signal transmitted via the sense clock lines in the memory controller;

e) adjusting a delay time corresponding to a L=I propagation time needed by the data from the memory module to the memory controller in accordance with the measured propagation time of the transmitted sense clock signal in the memory controller.

Other features which are considered as characteristic for the invention are set forth in the appended claims.

Although the invention is illustrated and described herein as embodied in a configuration for data transmission in a semiconductor memory system, and a relevant data transmission method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
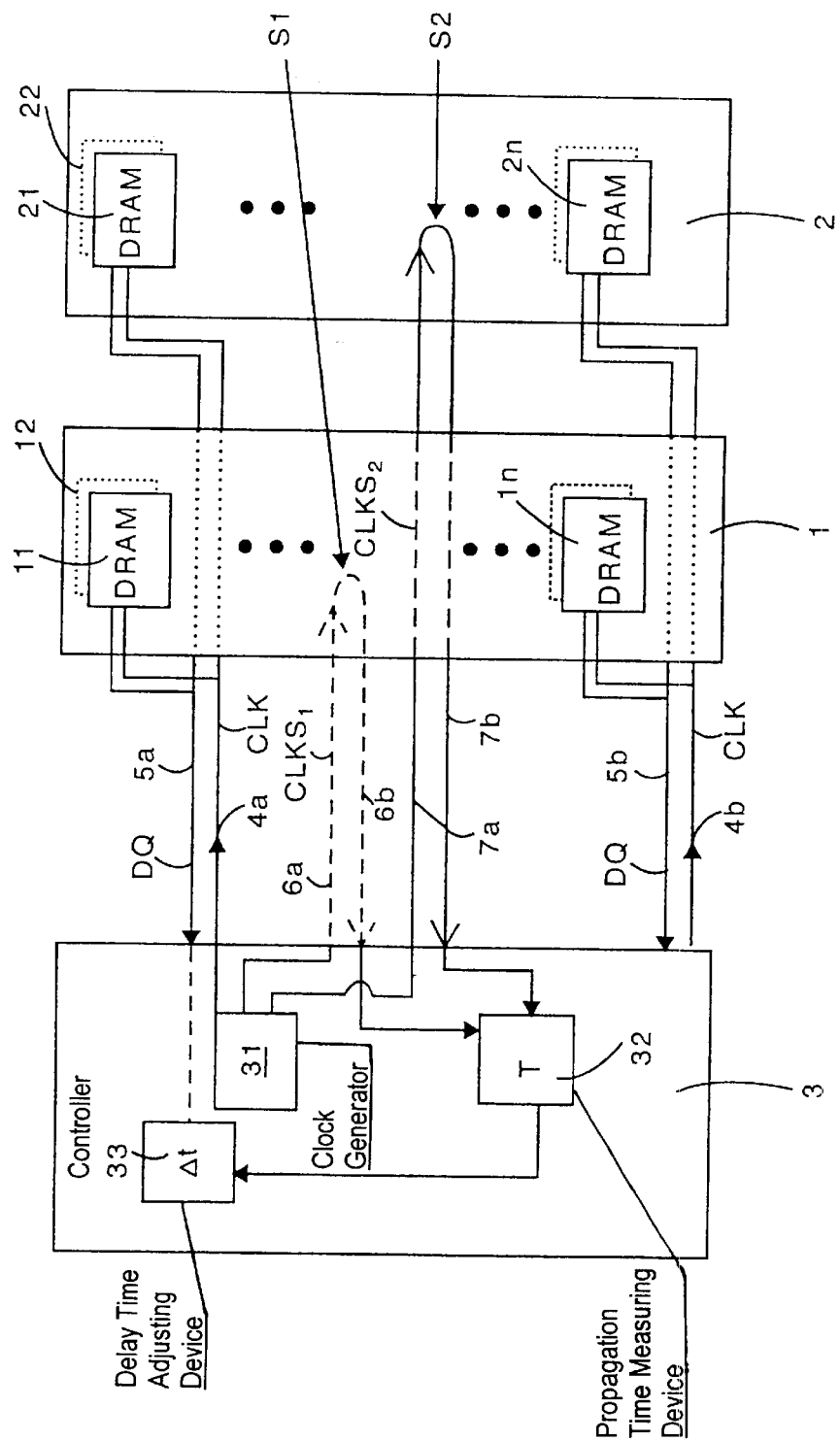
FIG. 1 is a block circuit diagram of a first embodiment of a data transmission configuration according to the invention.

Referring now to the figures of the drawing in detail and first, particularly, to FIG. 1 thereof, there is shown two semiconductor memory modules 1, 2 and a memory controller module 3 connected to them in order to drive them.

The semiconductor memory modules 1, 2 can be, for example, DIMM boards and each contain a plurality of memory chips, for example DRAM chips 11, 12, ... 1$n$ and 21, 22, ... 2$n$.

In the usual way, the memory controller module 3 generates a system clock signal CLK, which is fed to the semiconductor memory modules 1, 2 via a system clock line 4a. Data signals DQ requested by the memory controller 3 are transmitted from the memory modules 1, 2 via data lines 5a to the memory controller 3.

It should be mentioned here that the system clock signal CLK does not necessarily have to be generated by the memory controller 3 but can also be fed in from outside.

A clock generating device 31 in the memory controller module 3 generates sense clock signals CLKS1 and CLKS2, which are each fed separately via sense clock lines 6a, 6b and 7a, 7b to the memory module 1 and the memory module 2, looped through there via loops S1 and S2 and fed back to separate inputs of the memory controller 3. The sense clock lines 6a, 6b that carry the sense clock signal CLKS1 to the memory module 1 are connected through the loop S1 on the memory module 1 and in actual fact form a single sense clock signal line. Equally, the sense clock lines 7a, 7b on the memory module 2 are electrically connected to each other by the loop S2 and in actual fact form a single second sense clock signal line.

The sense clock signals CLKS1 and CLKS2 may be clock signals with the same frequency and phase angle. Alternatively, the sense clock signals CLKS1 and CLKS2 can also be generated with a respectively different phase angle by the clock generating device 31.

The memory controller 3 also contains a propagation time measuring device 32, which measures the respective propagation time of the sense clock signals CLKS1 and CLKS2 transmitted via the sense clock signal lines 6a, 6b and 7a, 7b to the memory modules 1, 2 and from there back to the memory controller module 3. The memory controller 3 also contains a delay time adjusting device 33, which make it possible in the memory controller to adjust a delay time Δt, which corresponds to the propagation time needed by the data signals from the respective memory module 1, 2 to the memory controller 3. The delay time Δt can be different for the various memory modules 1 and 2. Since the memory controller 3 "knows" from which memory chip the data has been requested, the corresponding delay time Δt can be adjusted by the delay time adjusting device 33 in accordance with the propagation time T, measured by the propagation time measuring device 32, of the sense clock signals CLKS1, CLKS2 transmitted via the sense clock line.

Figure 2:
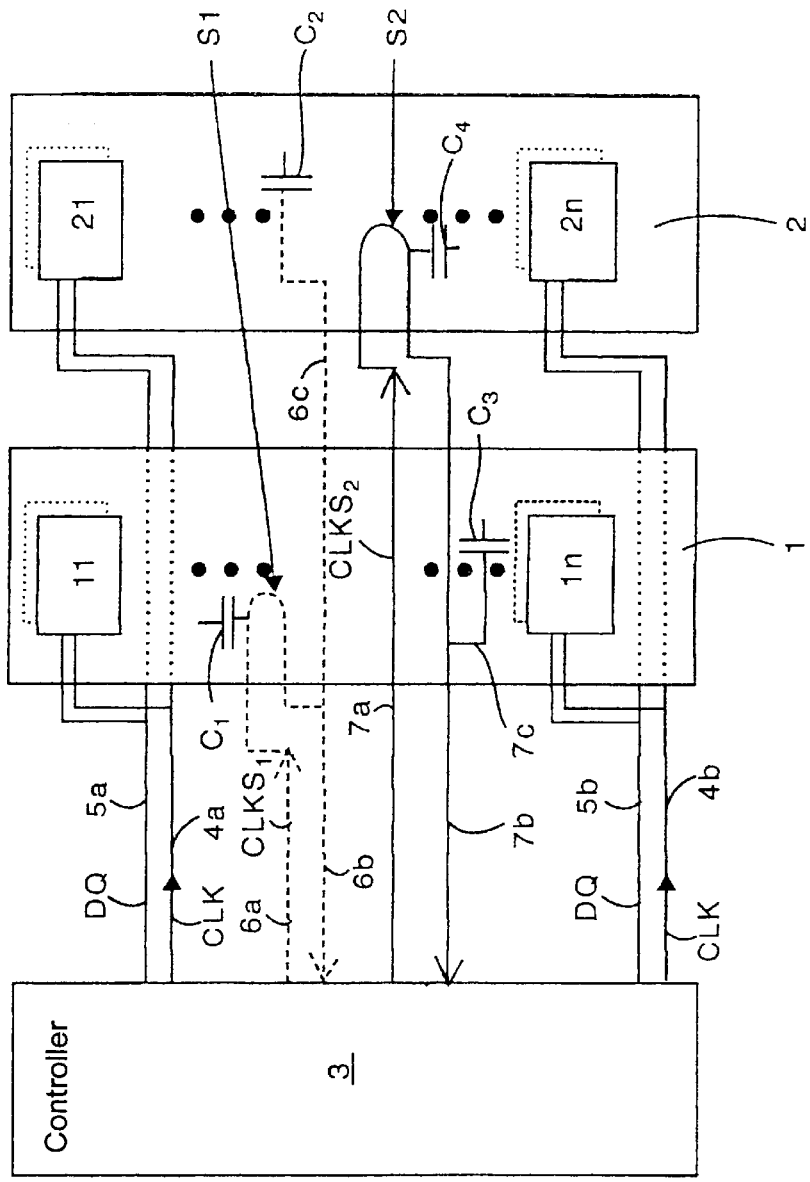
FIG. 2 is a block circuit diagram of a second embodiment of the data transmission configuration according to the invention.

The second embodiment, shown in FIG. 2, of the data transmission configuration according to the invention differs from the first embodiment, shown in FIG. 1, only in that the loops S1 and S2 formed on the memory modules 1 and 2 and belonging to the sense clock lines 6a, 6b and 7a, 7b are matched to the routing of the data lines 5a, 5b, in that at a suitable point passive components C1, C4 for matching the propagation time are connected to the loops S1, S2, and in that the sense clock signal CLKS1 and CLKS2 led back in each case from the memory modules 1 and 2 via the sense clock return lines 6b and 7b are also led over spur lines 6c and 7c to the respective other semiconductor memory module 2 and 1 and are terminated there by a passive component C2 and C3.

Instead of capacitors C1–C4, other passive components, such as resistors and inductors, can also be used in combination with capacitors in order to match the time delay of the sense clock signals to the system requirements.

The functions of the memory controller module 3 are substantially identical to the functions of the memory controller module 3 according to FIG. 1. They therefore do not need to be explained again.

Figure 3:
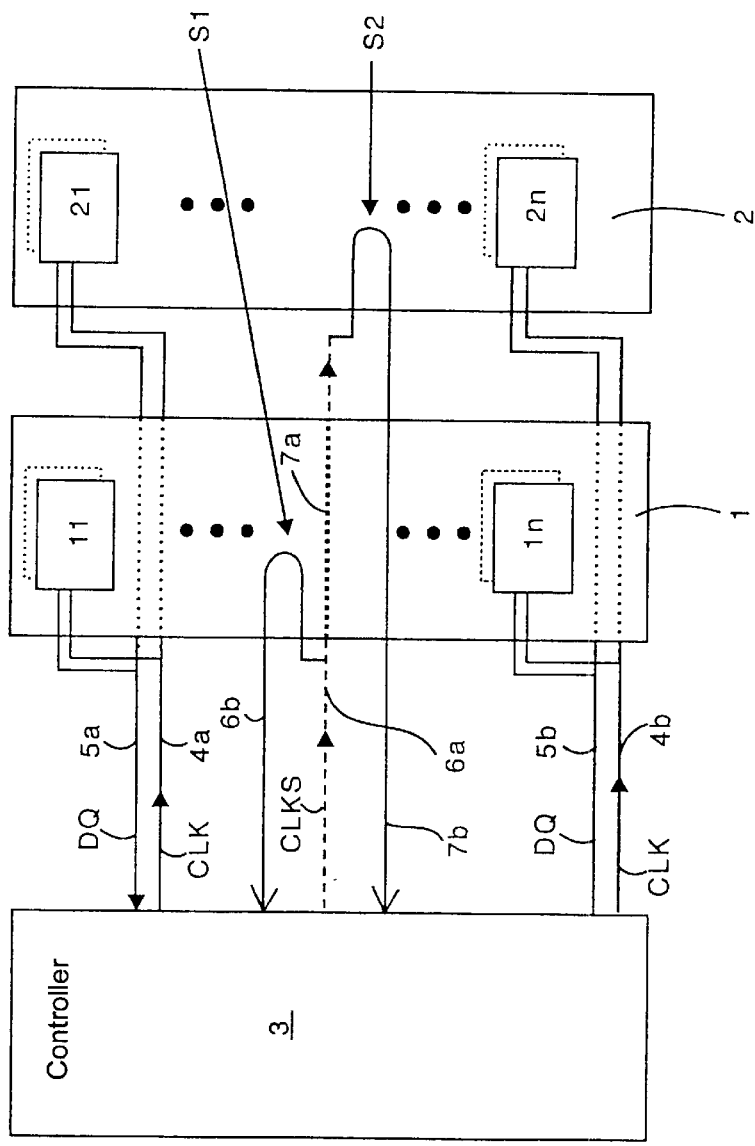
FIG. 3 is a block circuit diagram of a third embodiment of the data transmission configuration according to the invention.

The third embodiment, shown in a manner of a block circuit diagram in FIG. 3, of a data transmission configuration according to the invention differs from the first two embodiments, previously described and illustrated in FIGS. 1 and 2, in that the sense clock signal CLKS is led jointly to the two memory modules 1 and 2, which results in that the sense clock line 7a is merely an extension of the sense clock line 6a. The return lines 6b and 7b are still separated, so that the sense clock signal CLKS fed jointly to the two memory modules 1 and 2 can be received separately with a generally different propagation time by the memory controller module 3.

In the third embodiment, illustrated in FIG. 3, the functions of the memory controller module are also substantially identical to those in FIG. 1, with the exception that the clock generating device 31 has a single output for the sense clock signal CLKS.

By the inventive step of additionally introducing in the memory system the sense clock lines, on which a sense clock signal is transmitted from the memory controller module to the respective semiconductor memory modules for the purpose of propagation time measurement, the disadvantages described at the beginning of the use of the data strobe signal are avoided, since there is generally only one memory controller module in a memory system and the time conditions between the system clock signal and the sense clock signal generated on the memory controller module can be met exactly and can be tested simply with little test effort.

The exemplary embodiments described previously, which are illustrated in FIGS. 1 to 3, show two memory modules by way of example, which, for example, are DIMM memory modules fitted with a large number of DRAM chips. However, the invention is not restricted to two memory modules. More or fewer memory modules are possible. Likewise, memory systems are possible in which the memory modules do not use a circuit board substrate that is separate from the memory controller. The memory chips are then located on the main circuit board, which also contains the memory controller and the appropriate system clock and sense clock lines.

In all the exemplary embodiments of the invention it is important that the sense clock lines, which are driven by the memory controller, are led back directly from the respective memory module without an additional clock module being used there. As mentioned, however, various passive components can be connected to the sense clock line in order to match the time delay of the sense clock lines to the system requirements.

Furthermore, in an advantageous development, the embodiments according to the invention permit the sense clock signal to be stopped and continued after a desired time. In this case, "stopping" refers to the establishment from time to time of a constant state, such as "low", "high" or "state of high impedance". In this way, the propagation times on the sense clock signal lines can be measured again and again. As long as the sense clock signals are a periodic clock signal, they can be used to determine the phase angle of the data.

We claim:

1. A configuration for transmitting data in a semiconductor memory system, the configuration comprising:
   at least one semiconductor memory module;
   a memory controller controlled by a system clock signal, said memory controller having a clock generating device producing a sense clock signal in addition to the system clock signal, the data being transmitted between said memory controller and said semiconductor memory module;
   a clock line connected between said semiconductor memory module and said memory controller, said clock line transmitting the system clock signal to said memory module; and at least one separate sense clock line extending from said memory controller to said semiconductor memory module and directly back to said memory controller, said separate sense clock line transmitting the sense clock signal to said semiconductor memory module and from said semiconductor memory module back to said memory controller;

said memory controller further having a propagation time measuring device connected to said separate sense clock line for measuring a propagation time of the sense clock signal transmitted over said separate sense clock line and a delay time adjusting device connected to said propagation time measuring device, said delay time adjusting device adjusting a delay time corresponding to the propagation time needed by the data transmitted from said semiconductor memory module to said memory controller, said memory controller adjusting the delay time of said delay time adjusting device in accordance with the propagation time, measured by said propagation time measuring device, of the sense clock signal transmitted over said separate sense clock line.

2. The data transmission configuration according to claim 1, wherein said clock generating device generates the sense clock signal intermittently, the sense clock signal in holding states from time to time assuming a constant state being one of a low state, a high state, and a high impedance state.

3. The data transmission configuration according to claim 1, wherein:

said semiconductor memory module has a circuit substrate; and said separate sense clock line has at least one loop dimensioned to match the propagation time and disposed on said circuit substrate of said semiconductor memory module.

4. The data transmission configuration according to claim 1, further comprising at least one passive component connected to said separate sense clock line for matching the propagation time.

5. The data transmission configuration according to claim 1, wherein said semiconductor memory module is one of a plurality of memory modules and said separate sense clock line is one of a plurality of sense clock lines connected to said clock generating device, to said memory modules, and to said propagation time measuring device, each of said sense clock lines leading the sense clock signal separately from said memory controller to a respective one of said memory modules and separately from there back to said memory controller, and said propagation time measuring device is set up for a separate measurement of propagation times of the sense clock signal on each of said sense clock lines, and said delay adjusting device is set up for a separate adjustment of the delay time for respective data transmitted.

6. The data transmission configuration according to claim 1, wherein said semiconductor memory module is one of a plurality of memory modules and said separate sense clock line is one of a plurality of sense clock lines connected to said clock generating device, to said memory modules, and to said propagation time measuring device, said sense clock lines leading the sense clock signal from said memory controller jointly to each of said memory modules and from there separately back to said memory controller, and said propagation time measuring device is set up for a separate measurement of propagation times for the sense clock signal on each of said sense clock lines that leads back, and said delay adjusting device is set up for a separate adjustment of the delay time for respective data transmitted.

7. The data transmission configuration according to claim 1, wherein said clock generating device generating the sense clock signal at one of a same frequency and an integer multiple of a frequency of the system clock signal.

8. A memory controller module for use in a data transmission configuration in a semiconductor memory system, the data being transmitted between at least one semiconductor memory module and the memory controller module controlled by a system clock signal, the memory controller module comprising:

a clock generating device generating a sense clock signal having one of an equivalent frequency and an integer multiple of a frequency of the system clock signal;

a sense clock line;

a sense clock input connected to said sense clock line and receiving the sense clock signal transmitted over said sense clock line to said semiconductor memory module and from there back to said sense clock input;

a propagation time measuring device connected to said sense clock input and measuring a propagation time of the sense clock signal transmitted via said sense clock line and received at said sense clock input; and a delay adjusting device set up for adjusting a delay time corresponding to the propagation time of the data transmitted from the semiconductor memory module to the memory controller, said delay adjusting device adjusting the delay time in accordance with the propagation time of the sense clock signal received as measured by the propagation time measuring device.

9. A semiconductor memory module for use in a semiconductor memory system, in which data is transmitted between the semiconductor memory module and a memory controller controlled by a system clock signal, the semiconductor memory module comprising:

terminals; and at least one conductor loop for connecting to a sense clock line and for looping a sense clock signal transmitted via the sense clock line through the semiconductor memory module.

10. A method for transmitting data in a semiconductor memory system, the data being transmitted between at least one semiconductor memory module and a memory controller controlled by a system clock signal, which comprises the steps of:

generating a sense clock signal in the memory controller on a basis of the system clock signal;

leading at least one additional sense clock line from the memory controller to the semiconductor memory module and from the semiconductor memory module directly back to the memory controller;

transmitting the sense clock signal via the additional sense clock line from the memory controller to the semiconductor memory module and from the semiconductor memory module back to the memory controller;

measuring a propagation time of the sense clock signal, transmitted via the additional sense clock line, in the memory controller; and adjusting a delay time corresponding to the propagation time in the memory controller needed by the data from the semiconductor memory module to the memory controller in accordance with the propagation time of the sense clock signal.

11. The data transmission method according to claim 10, wherein the generating step comprises generating the sense clock signal intermittently such that in holding states from time to time the sense clock signal assumes a constant state.

12. The data transmission method according to claim 10, wherein the leading step comprises leading the additional sense clock line on the semiconductor memory module in a form of at least one loop, the loop being dimensioned to match the propagation time of the sense clock signal carried by the additional sense clock line.

13. The data transmission method according to claim 10, wherein the leading step comprises connecting at least one passive component to the additional sense clock line to match the propagation time of the sense clock signal transmitted via the additional sense clock line.

14. The data transmission method according to claim 10,
which comprises forming the semiconductor system with a plurality of memory modules;
wherein the leading step comprises leading a plurality of sense clock lines for transmitting the sense clock signal and in each case one of the sense clock lines is led separately from the memory controller to a respective one of the memory modules and from there separately back to the memory controller;
wherein the measuring step comprises measuring the propagation time of the sense clock signal transmitted over each of the sense clock lines; and
wherein the adjusting step comprises adjusting delay times for the data transmitted to each of the memory modules in accordance with separately determined propagation times.

15. The data transmission method according to claim 10, which comprises:
providing a plurality of memory modules;
providing a plurality of sense clock lines connected such that the sense clock signal is transmitted jointly from the memory controller to each of the memory modules and from the memory modules separately back to the memory controller; and
measuring the propagation time of the sense clock signal on each of the sense lock lines leading back to the memory controller, and the delay time for the respective data transmitted to each of the memory modules is adjusted separately in accordance with the propagation time measured.

16. The method according to claim 10, wherein the generating step comprises generating the sense clock signal with one of an equivalent frequency and an integer multiple of a frequency of the system clock signal.

17. The data transmission method according to claim 11, which comprises selecting the constant state from the group consisting of a low state, a high state, and a high impedance state.

* * * * *